(12) United States Patent
Fukuta et al.

(10) Patent No.: US 8,829,836 B2
(45) Date of Patent: Sep. 9, 2014

(54) DRIVER FOR SWITCHING ELEMENT AND CONTROL SYSTEM FOR ROTARY MACHINE USING THE SAME

(71) Applicant: Denso Corporation, Kariya (JP)

(72) Inventors: Junichi Fukuta, Anjo (JP); Tsuneo Maebara, Nagoya (JP); Yoshiyuki Hamanaka, Kariya (JP)

(73) Assignee: Denso Corporation, Kariya (JP)

( * ) Notice: Subject to any disclaimer, the term of this patent is extended or adjusted under 35 U.S.C. 154(b) by 80 days.

(21) Appl. No.: 13/738,304

(22) Filed: Jan. 10, 2013

(65) Prior Publication Data

US 2013/0175959 A1 Jul. 11, 2013

(30) Foreign Application Priority Data

Jan. 10, 2012 (JP) .................. 2012-001933

(51) Int. Cl.
*H02P 6/14* (2006.01)
*H02M 1/08* (2006.01)

(52) U.S. Cl.
USPC .............. 318/400.27; 318/400.22; 318/400.3; 318/400.37; 327/109; 327/419

(58) Field of Classification Search
USPC .............. 318/400.27, 400.22, 400.3, 400.37; 327/109, 419
See application file for complete search history.

(56) References Cited

U.S. PATENT DOCUMENTS

| | | | | |
|---|---|---|---|---|
| 4,987,964 A | * | 1/1991 | Tabuse ........................... | 180/446 |
| 5,565,841 A | * | 10/1996 | Pandohie ...................... | 340/479 |
| 5,801,911 A | * | 9/1998 | Goto et al. ....................... | 361/22 |
| 5,808,504 A | | 9/1998 | Chikai et al. | |
| 6,076,172 A | * | 6/2000 | Kimura et al. .................. | 714/24 |
| 6,148,055 A | * | 11/2000 | Sakai et al. ...................... | 377/28 |
| 6,292,524 B1 | * | 9/2001 | Sakai et al. ...................... | 377/28 |
| 7,457,988 B2 | * | 11/2008 | Nishimura et al. ............. | 714/34 |
| 8,350,601 B2 | * | 1/2013 | Nagata et al. .................. | 327/109 |
| 2004/0201935 A1 | * | 10/2004 | Yamamoto ................... | 361/93.1 |
| 2005/0017787 A1 | | 1/2005 | Kojima | |
| 2011/0133790 A1 | * | 6/2011 | Nagata et al. ................. | 327/109 |
| 2011/0285335 A1 | * | 11/2011 | Tada ........................ | 318/400.22 |

FOREIGN PATENT DOCUMENTS

| | | |
|---|---|---|
| JP | 9-47015 | 2/1997 |
| JP | 3052619 | 4/2000 |
| JP | 3339311 | 8/2002 |
| JP | 3373704 | 11/2002 |

(Continued)

OTHER PUBLICATIONS

Office Action (2 pgs.) dated Jan. 28, 2014 issued in corresponding Japanese Application No. 2012-001933 with an at least partial English-language translation thereof (2 pgs.).

*Primary Examiner* — Paul Ip
(74) *Attorney, Agent, or Firm* — Nixon & Vanderhye P.C.

(57) ABSTRACT

In a driver, a charging module stores negative charge on the gate of a switching element via a normal electrical path to charge the switching element upon a drive signal representing change of an on state to an off state. This shifts the on state of the switching element to the off state. An adjusting module changes a value of a parameter correlating with a charging rate of the switching element through the normal electrical path as a function of an input signal to the driver. The input signal represents a current flowing through the conductive path, a voltage across both ends of the conductive path, or a voltage at the gate. A disabling module disables the adjusting module from changing the value of the parameter if the drive signal represents the on state of the switching element.

12 Claims, 8 Drawing Sheets

(56) References Cited

FOREIGN PATENT DOCUMENTS

| JP | 2004-312924 | 11/2004 |
| JP | 2005-45428 | 2/2005 |
| JP | 2006-296119 | 10/2006 |
| JP | 2009-60358 | 3/2009 |

* cited by examiner

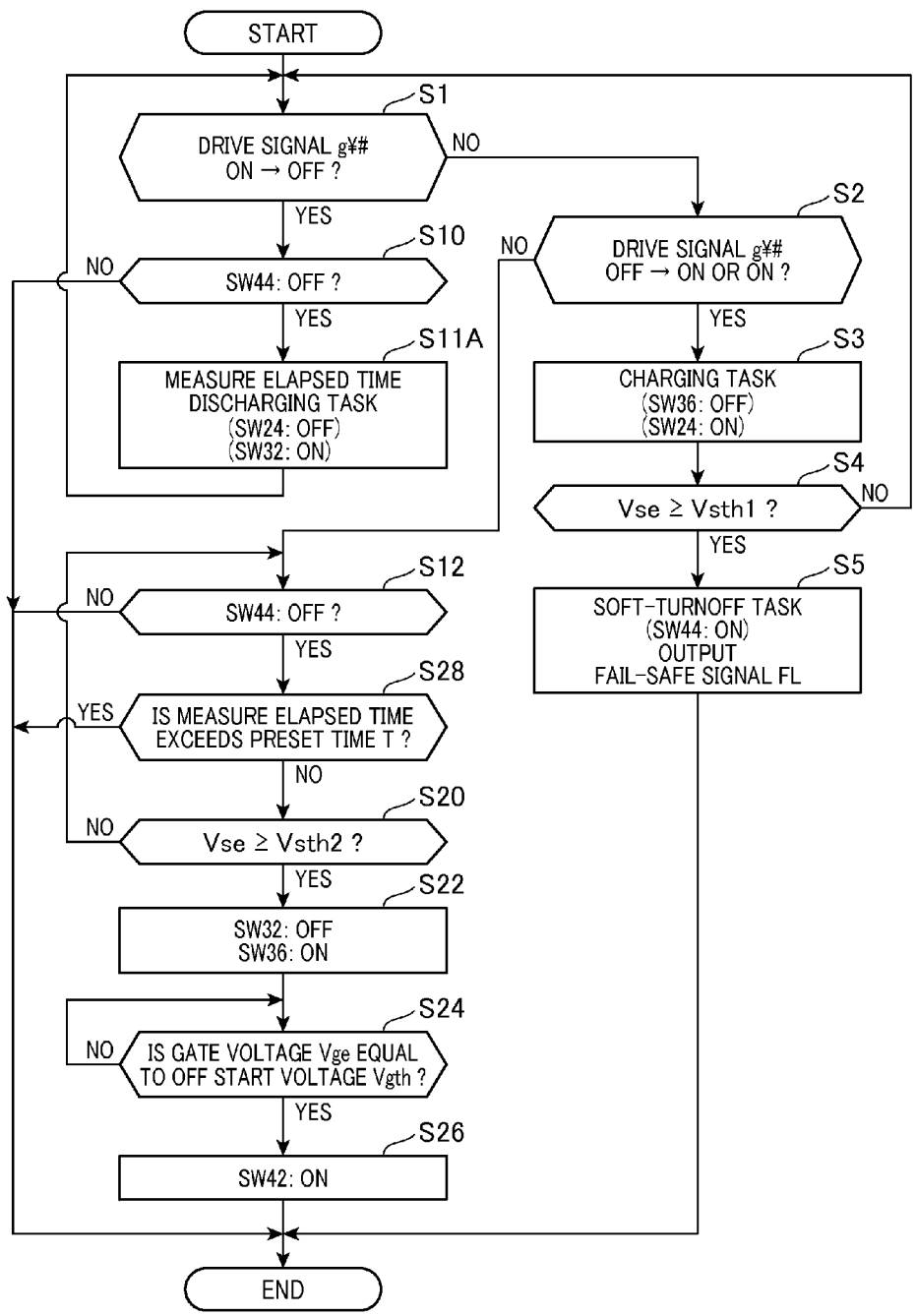

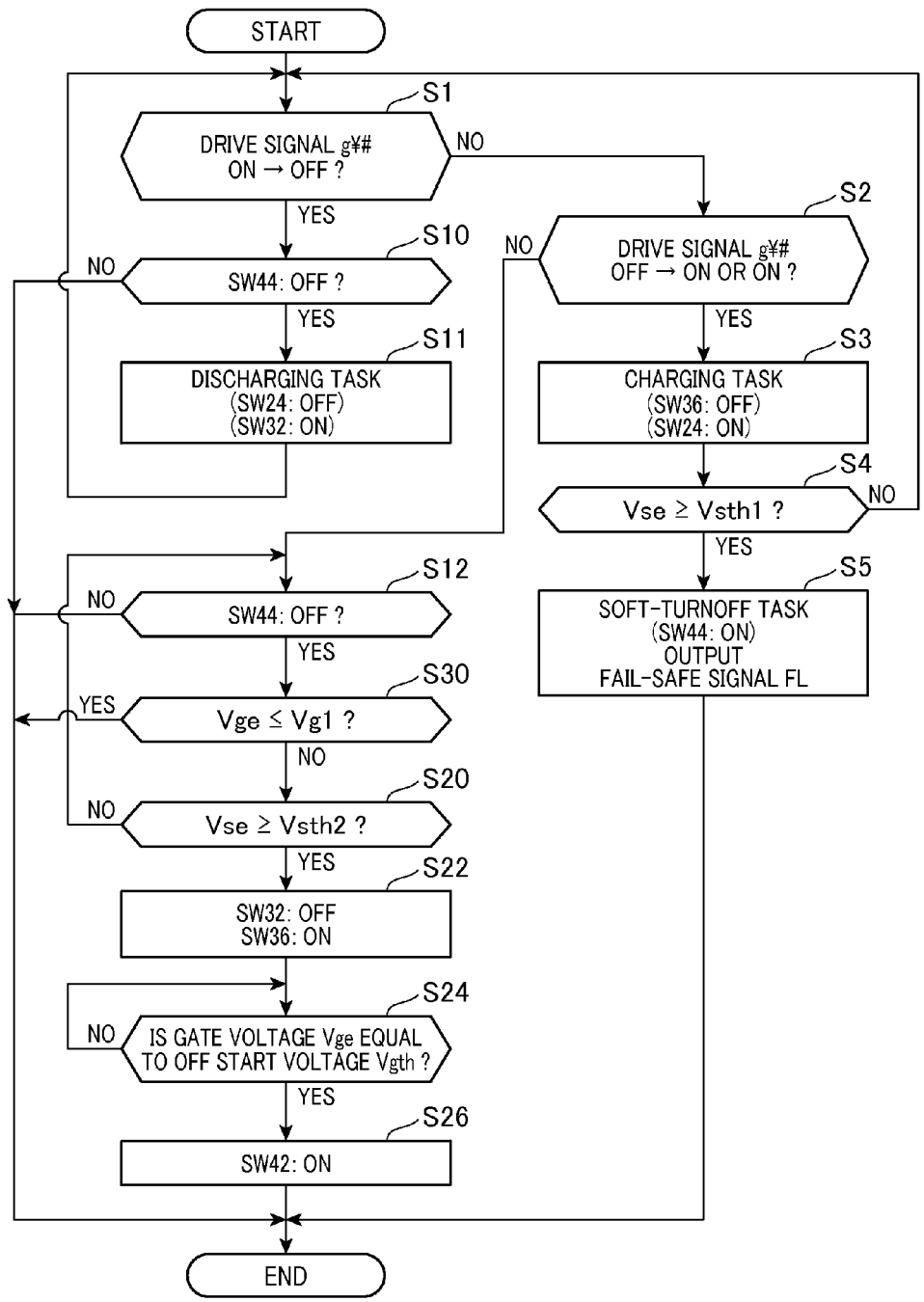

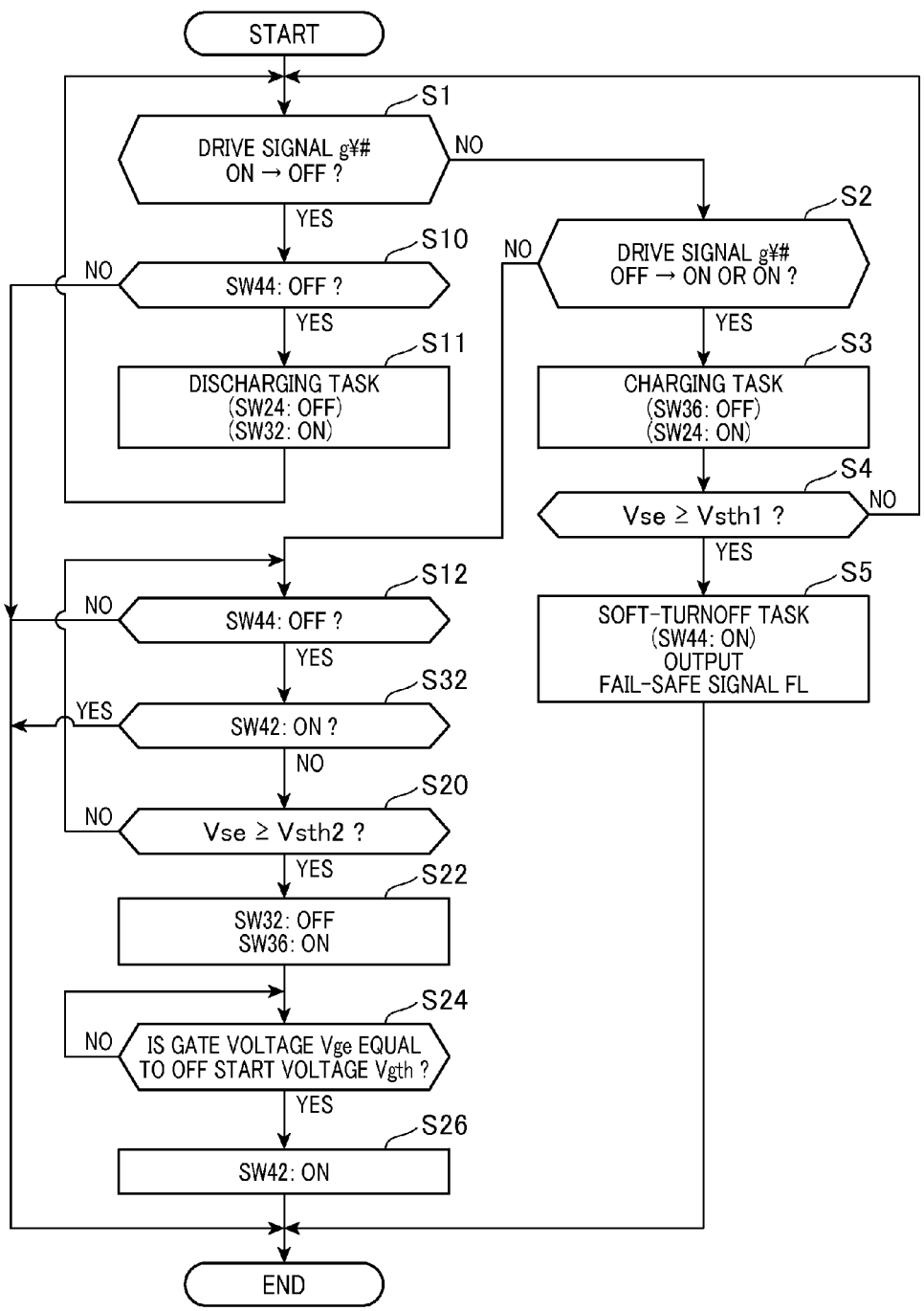

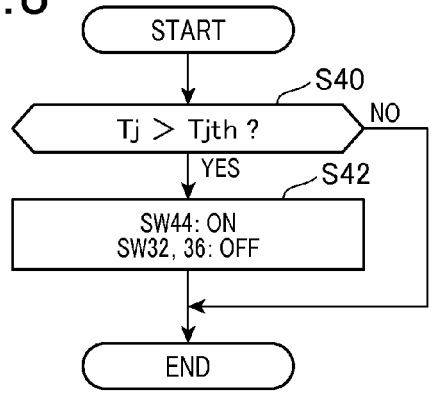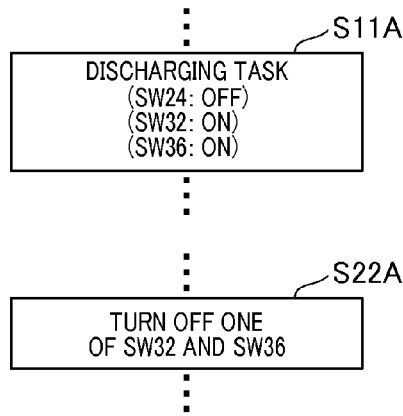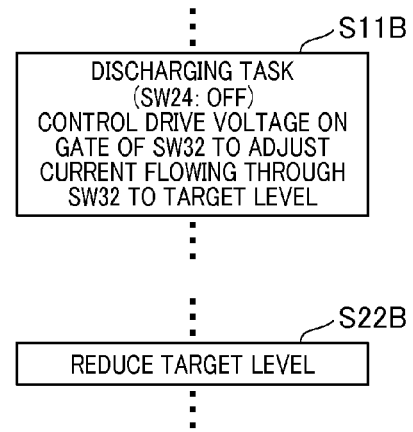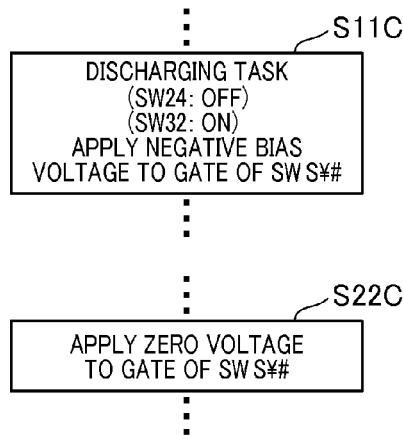

DRIVER FOR SWITCHING ELEMENT AND CONTROL SYSTEM FOR ROTARY MACHINE USING THE SAME

CROSS REFERENCE TO RELATED APPLICATIONS

This application is based on and claims the benefit of priority from Japanese Patent Application 2012-001933 filed on Jan. 10, 2012, the disclosure of which is incorporated in its entirety herein by reference.

TECHNICAL FIELD

The present disclosure relates to drivers for selectively storing and dissipating electrical charge on and from the control terminals of voltage-controlled switching elements to selectively turn on and off the voltage-controlled switching elements. The present disclosure also relates to control systems for rotary machines using the drivers.

BACKGROUND

Voltage-controlled switching elements, such as IGBTs (Insulated-Gate Bipolar Transistors) and MOS transistors, have control terminals; selectively storing and dissipating electrical charge on and from the control terminal of a voltage-controlled switching element allows the voltage-controlled switching element to be selectively turned on and off. These voltage-controlled switching elements are used as H bridges for motor control. An H bridge is comprised of four switches designed to enable a load current to flow through a load in either direction.

Such an H bridge is illustrated in FIG. 5 of Japanese Examined Patent Publication No. 3339311; as each switch of the H bridge, a pair of an IGBT and a flywheel diode are used. The Japanese Examined Patent Publication No. 3339311 will be referred to as a known publication. As illustrated in the left view of FIG. 6 of the known publication, let us consider a case where a load current $I_L$ flows through a load 23 and a low-side IGBT 25 in the direction of arrow $I_L$. In this case, turn-off of the IGBT 25 causes the load current $I_L$ to flow to a flywheel diode 28 for a corresponding higher-side IGBT 24 (see FIG. 5 of the known publication) and flow therethrough. This results in a reduction of a collector current $I_C$, which has been flowing through the IGBT 25. Stray inductance $L_S$ in a line connected to both ends (emitter and collector) of the conductive path of the IGBT 25 and the rate of reduction in the collector current $I_C$, which will be referred to as $-dI_C/dt$, produce a surge $\Delta Vp$. The surge $\Delta Vp$ is applied to the IGBT 25 and a flywheel diode 29 (see FIG. 5 of the known publication). The surge $\Delta Vp$ is illustrated in the lower side of the right view of FIG. 6.

In order to reduce the surge $\Delta Vp$, it is necessary to reduce the rate $(-dI_C/dt)$ of reduction in the collector current $I_C$, and in order to reduce the rate $(-dI_C/dt)$ of reduction in the collector current $I_C$, it is necessary to reduce the switching speed of the IGBT 25.

Thus, the known publication discloses a driver for a voltage-controlled switching element, such as an IGBT, which is capable of reducing the switching speed of the voltage-controlled switching element upon detection of a decrease in a current, such as a collector current, flowing through the voltage-controlled switching element.

Specifically, this approach provides a driver for a voltage-controlled switching element, such as an IGBT; the driver includes two discharge paths connected to the voltage-controlled switching element and having different resistance values. The driver also includes a path to which a current measurement signal indicative of the magnitude of a current flowing through the voltage-controlled switching element is inputted. The driver is operative to selectively store electrical charge on the control terminal of the voltage-controlled switching element and dissipate the electrical charge stored in the control terminal of the voltage-controlled switching element therefrom via the two discharge paths. This approach is designed such that the driver opens one of the two discharge paths having the higher resistance value while closing the other having the lower resistance value when the current measurement signal indicates that a current flowing through the voltage-controlled switching element drops. This approach makes it possible to reduce the rate of reduction of a current flowing through the voltage-controlled switching element, thus reducing a surge produced based on the rate of reduction of the current flowing through the voltage-controlled switching element.

SUMMARY

If noise components are superimposed on the path to which the current measurement signal is inputted, the driver may erroneously determine that the current flowing through the voltage-controlled switching element drops although it does not drop, and close the discharge path having the higher resistance value by mistake. This may reduce the switching speed of the voltage-controlled switching element although the reduction is not needed.

In view of the circumstances set forth above, one aspect of the present disclosure seeks to provide drivers for selectively storing and dissipating electrical charge on and from the control terminals of voltage-controlled switching elements, which are designed to solve the problem set forth above.

Specifically, an alternative aspect of the present disclosure aims to provide such drivers, which are capable of reducing a surge without erroneously reducing the switching speed of the corresponding voltage-controlled switching elements due to noise.

According to a first exemplary aspect of the present disclosure, there is provided a driver for driving a voltage-controlled switching element having a conductive path and an on-off control terminal according to a drive signal indicating selectively a first state and a second state of the voltage-controlled switching element. The first state is one of an on state and an off state of the voltage-controlled switching element, the second state being the other state thereof. The driver includes a charging module configured to store electrical charge on the on-off control terminal of the voltage-controlled switching element via a normal electrical path connected to the on-off control terminal to charge the voltage-controlled switching element upon the drive signal indicating a change of the voltage-controlled switching element from the first state to the second state, thus changing the voltage-controlled switching element from the first state to the second state. The driver includes an adjusting module configured to change a value of a parameter correlating with a charging rate of the voltage-controlled switching element through the normal electrical path as a function of an input signal to the driver to adjust the charging rate therethrough. The input signal represents at least one of: a current flowing through the conductive path, a voltage across both ends of the conductive path, and a voltage at the on-off control terminal. The driver includes a disabling module configured to disable the adjusting module from changing the value of the parameter if the drive signal indicates the first state of the voltage-controlled switching element.

Even if noise enters the input signal within a period during which the drive signal indicates the first state, which is clearly different from the period of a change of the voltage-controlled switching element from the first state to the second state, the driver according to the first exemplary aspect of the present disclosure disables the adjusting module from changing the value of the parameter. This prevents malfunctions of the adjusting module due to the noise. Note that electrical charge for changing the voltage-controlled switching element from the first state to the second state is not limited to positive charge, and therefore can be set to negative charge. Thus, in the present disclosure, storing negative charge on the on-off control terminal of a voltage-controlled switching element means dissipating positive charge from the on-off control terminal thereof.

According to a second exemplary aspect of the present disclosure, there is provided a control system for controlling a rotary machine. The control system includes a converter equipped with at least one pair of first voltage-controlled switching elements connected in series, each of the first voltage-controlled switching elements having a conductive path and an on-off control terminal. The control system includes an inverter equipped with at least one pair of second voltage-controlled switching elements connected in series. Each of the second voltage-controlled switching elements has a conductive path and an on-off control terminal. The control system includes a driver for driving each of the first and second voltage-controlled switching elements according to a drive signal drive signal indicating selectively a first state and a second state of a corresponding one of the first and second voltage-controlled switching elements to thereby boost a DC voltage inputted to the converter, and invert the boosted DC voltage into an AC voltage to be supplied to the rotary machine. The first state is one of an on state and an off state of a corresponding one of the first and second voltage-controlled switching elements, and the second state is the other thereof. The driver for each of the first and second voltage-controlled switching elements includes a charging module configured to store electrical charge on the on-off control terminal of a corresponding one of the first and second voltage-controlled switching elements via a normal electrical path connected to the on-off control terminal to charge a corresponding one of the first and second voltage-controlled switching elements upon the drive signal indicating a change of a corresponding one of the first and second voltage-controlled switching elements from the first state to the second state, thus changing a corresponding one of the first and second voltage-controlled switching elements from the first state to the second state. The driver for each of the first and second voltage-controlled switching elements includes an adjusting module configured to change a value of a parameter correlating with a charging rate of a corresponding one of the first and second voltage-controlled switching elements through the normal electrical path as a function of an input signal to the driver to adjust the charging rate therethrough. The input signal representing at least one of: a current flowing through the conductive path, a voltage across both ends of the conductive path, and a voltage at the on-off control terminal. The driver for each of the first and second voltage-controlled switching elements includes a disabling module configured to disable the adjusting module from changing the value of the parameter if the drive signal indicates the first state of a corresponding one of the first and second voltage-controlled switching elements.

Because the converter and the inverter of the control system according to the second exemplary aspect of the present disclosure include a driver according to the first exemplary aspect of the present disclosure for each of the first and second voltage-controlled switching elements, the control system achieves the same technical effect as the driver according to the first exemplary aspect of the present disclosure does.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 5 is a flowchart schematically illustrating an example of the charging and discharging control routine carried out by each drive unit of a control system according to a second embodiment of the present disclosure;

FIG. 6 is a flowchart schematically illustrating an example of the charging and discharging control routine carried out by each drive unit of a control system according to a third embodiment of the present disclosure;

FIG. 7 is a flowchart schematically illustrating an example of the charging and discharging control routine carried out by each drive unit of a control system according to a fourth embodiment of the present disclosure;

FIG. 8 is a flowchart schematically illustrating an example of the routine of abnormal diagnosis carried out by each drive unit of a control system according to a fifth embodiment of the present disclosure; and FIGS. 9A to 9C are flowcharts illustrating some modifications of the first to fifth embodiments of the present disclosure.

DETAILED DESCRIPTION OF EMBODIMENT

Figure 1:
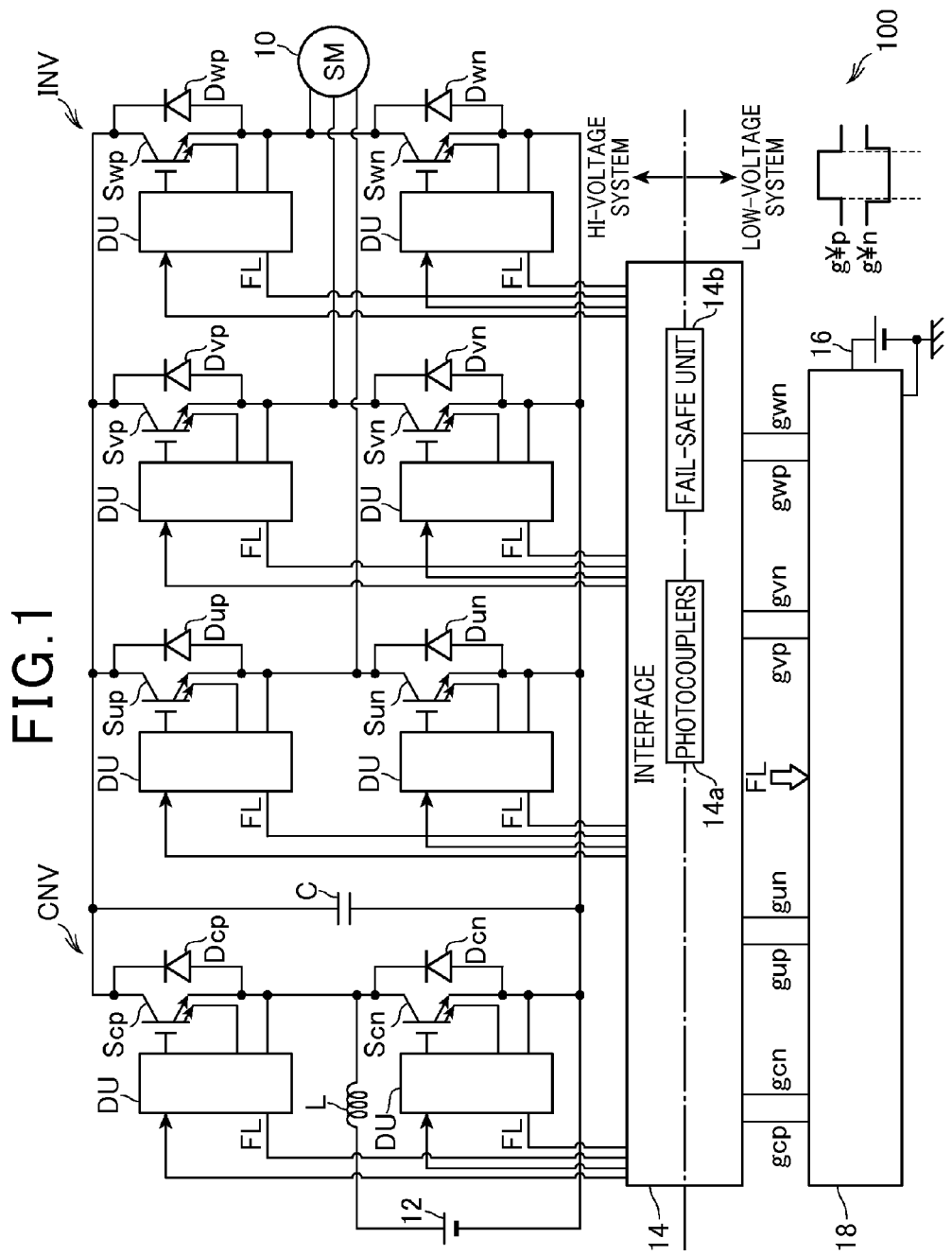
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified to avoid redundant description.

First Embodiment

Referring to FIG. 1, there is illustrated a three-phase motor-generator as an example of rotating machines, referred to simply as a "motor-generator" 10, installed in, for example, a motor vehicle as a main engine according to the first embodiment. The motor-generator 10 is mechanically coupled to driving wheels (not shown) of the motor vehicle.

For example, as the motor-generator 10, a brush-less DC motor, i.e. a three-phase SM (Synchronous Motor), is used.

The motor-generator 10 is made up of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter INV, a converter CNV, a high-voltage battery 12 as an example of DC power sources, drive units, i.e. drivers, DU, an interface 14, a low-voltage battery 16, and a control unit 18.

To the motor-generator 10, the high-voltage battery 12 is electrically connected via the inverter INV and the converter CNV. The high-voltage battery 12 has a terminal voltage thereacross, which is, for example, equal to or higher than 100 V.

The converter CNV includes a capacitor C, a pair of series-connected switching elements Scp and Scn, a pair of flywheel diodes Dcp and Dcn, and a reactor L. The capacitor C is connected in parallel to the inverter INV, and the series-connected switching elements Scp and Scn are connected in parallel to the capacitor C. The flywheel diodes Dcp and Dcn are connected in antiparallel to the corresponding switching elements Scp and Scn, respectively. One end of the reactor L is connected to both the positive terminal of the high-voltage battery 12 and the connection point between the switching elements Scp and Scn. One end of the series-connected switching elements Scp and Scn of the converter CNV is connected to the positive DC input line of the inverter INV, and the other end thereof is connected to the negative DC input line of the inverter INV. The negative DC input line of the inverter INV is connected to the negative terminal of the battery 12.

The converter CNV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CNV is set to a predetermined high voltage, such as 666 V.

The inverter INV is designed as a three-phase inverter. The inverter INV is provided with three pairs of series-connected high- and low-side (upper- and lower-arm) switching elements Sup and Sun, Svp and Svn, and Swp and Swn. The inverter INV is also provided with flywheel diodes D¥#(¥=u, v, w, #=p, n) electrically connected in antiparallel to the corresponding switching elements S¥#(¥=u, v, w, #=p, n), respectively.

In the first embodiment, as the switching elements S¥# (¥=u, v, w, #=p, n), IGBTs are respectively used.

When power MOSFETs are used as the switching elements S¥#(¥=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S¥p (¥=u, v, w) is connected to a corresponding one of the S¥n (¥=u, v, w) in series is connected to an output lead extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line.

For example, the control unit 18 operates on a power-supply voltage, lower than the terminal voltage across the high-voltage battery 12, supplied from the low-voltage battery 16. Thus, the control unit 18 and the low-voltage battery 16 constitute a low voltage system. In contrast, the motor-generator 10, the converter CNV, the inverter INV, and the high-voltage battery 12 constitute a high voltage system.

The high voltage system uses a frame ground (chassis ground) of the motor vehicle as its reference potential; the reference potential is set to the median value of the potential at the positive terminal of the high-voltage battery 12 and that at the negative terminal thereof because the neutral point is connected to the frame (chassis) of the motor vehicle.

On the other hand, the low voltage system uses the frame ground of the motor vehicle as its reference potential set to the potential at the negative terminal of the low-voltage battery 16. That is, the potential at the negative terminal of the high-voltage battery 12 and that at the potential of the low-voltage battery 16 are different from each other.

The interface 14 is provided with insulation members, such as photocouplers 14a provided for the respective switching elements S¥# of the inverter INV and converter CNV. Each of the photocouplers 14a is comprised of a photodiode and a phototransistor. The photocouplers 14a are configured to enable communications between the high and low voltage systems while establishing electrical insulation therebetween. Specifically, each of the photocouplers 14a is configured to enable the control unit 18 to control a corresponding one of the switching elements S¥# while establishing electrical insulation between the control unit 18 and a corresponding one of the switching elements S¥#.

The control unit 18 is designed to individually drive the inverter INV and the converter CNV to thereby control a controlled variable of the motor-generator 10, such as an output torque of the motor-generator 10.

Specifically, the control unit 18 is designed to individually send drive signals gcp and gcn to the drive units DU provided for the respective switching elements Scp and Scn, thus individually turning on or off the respective switching elements Scp and Scn. The control unit 18 is also designed to individually send drive signals gup, gun, gvp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn convert the output DC voltage across the capacitor C into an AC voltage, and supply the AC voltage to the motor-generator 10.

Each of the drive signals g¥# has a predetermined duty cycle, i.e. a predetermined ratio of on duration to the total duration of each switching cycle for a corresponding one of the switching elements S¥# (see FIG. 1). Specifically, the control unit 18 is designed to complementarily turn on the high- and low-side switching elements SȲ# for each leg (phase) via the corresponding drive units DU according to the corresponding drive signals gȲ#. In other words, the control unit 18 is designed to alternately turn on the high-side switching element SȲp for one leg (phase) and the low-side switching element SȲn for the same leg (phase). This drive alternately closes the conductive path between the collector and emitter of the high-side switching element SȲp for one leg and the conductive path between the collector and emitter of the high-side switching element SȲn for the same leg.

Next, an example of the circuit structure of each drive unit DU provided for a corresponding one switching element SȲ# will be described with reference to FIG. 2.

Figure 2:
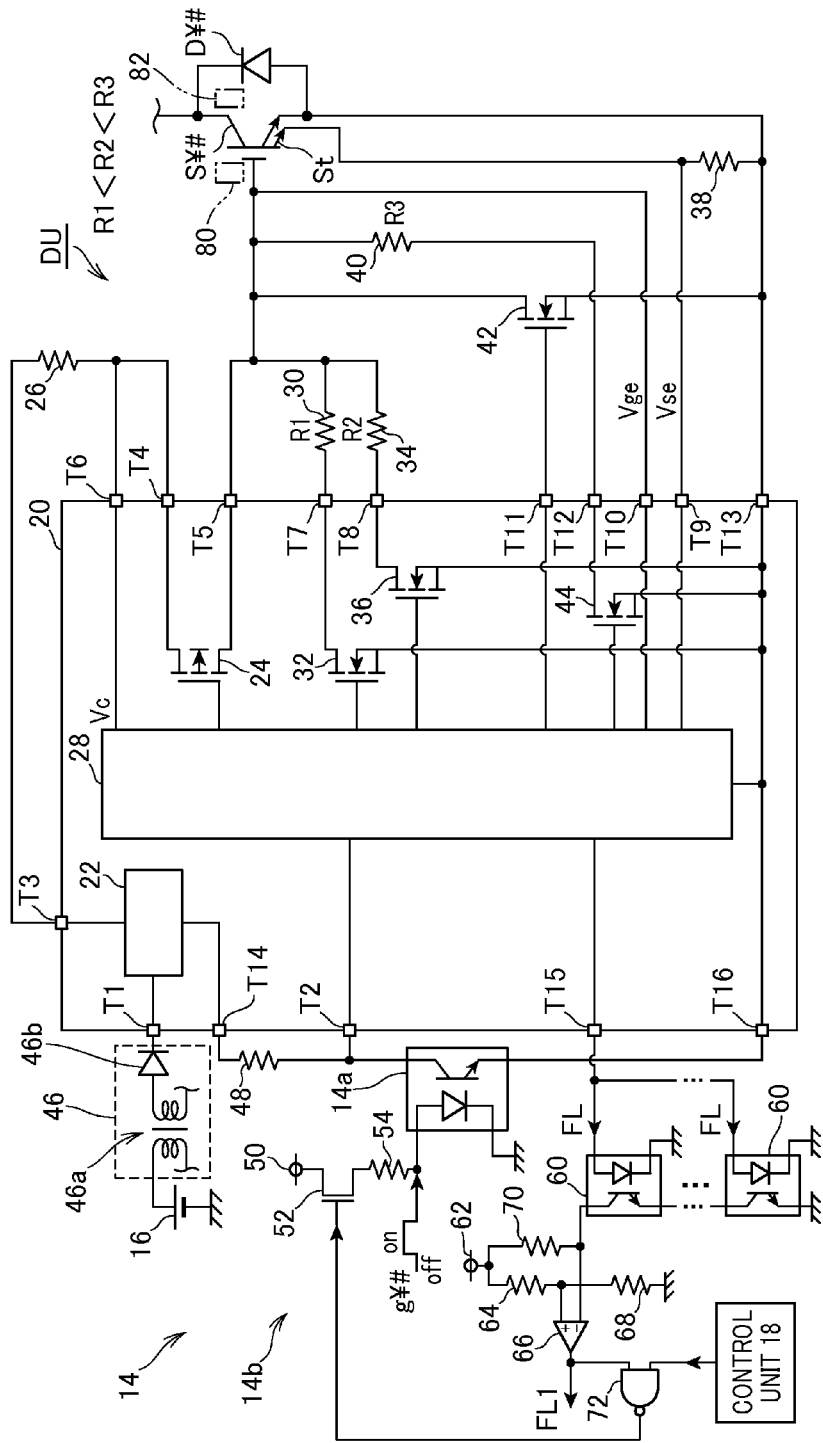
FIG. 2 is a circuit diagram schematically illustrating each drive unit of the control system illustrated in FIG. 1.

Referring to FIG. 2, the drive unit DU is comprised of a drive IC 20 on a chip, resistors 26, 30, 34, 38, 40, and 48, and an off-state holding switching element 42.

The drive IC 20 has terminals T1 to T16, a regulator 22, a constant-current switching element 24, a drive controller 28, a first discharge switching element 32, a second discharge switching element 36, and a soft-turnoff switching element 44. As the constant-current switching element 24, a P-channel MOSFET is used, and as each of the switching elements 32, 36, 42, and 44, an N-channel MOSFET is used.

An input terminal of the regulator 22 is connected to a flyback converter 46 installed in, for example, the interface 18 via the terminal T1 of the drive IC 20. The flyback converter 46 is comprised of a transformer 46a and a diode 46b; the transformer 46a includes a primary winding and a secondary winding. Magnetic energy charged in the primary winding based on the voltage across the low-voltage battery 16 induces a voltage across the secondary winding, and power based on the voltage induced across the secondary winding is supplied via the diode 46b and the terminal T1 of the drive IC 20 to the regulator 22.

The regulator 22 is operative to regulate the voltage supplied from the flyback converter 46 to a constant level, and output a voltage with the constant level. For example, the output voltage of the regulator 22 also serves as a power supply voltage for each component of the drive unit DU.

A first output terminal of the regulator 22 is connected to each of the photocoupler 14a and the terminal T2 of the drive IC 20 via the resistor 48, i.e. the pull-up resistor 48. The terminal T2 is connected to the drive controller 28. That is, if the photocoupler 14a is OFF, the resistor 48 pulls up the potential of the terminal T2 of the drive IC 20 to the constant voltage level. Otherwise, if the photocoupler 14a is ON, the terminal T2 of the drive IC 20 is connected to a common potential line of the drive unit DU via the photocoupler 14a. The common potential at the common potential line is set to a low voltage level, for example, a ground voltage level lower than the constant voltage level.

That is, if the photocoupler 14a is OFF, a high voltage level is inputted to the drive controller 28 via the terminal T2, and otherwise if the photocoupler 14a is ON, a low voltage level is inputted to the drive controller 28 via the terminal T2.

A second output terminal of the regulator 22 is connected to the source of the constant-current switching element 24 via the terminal T3 of the drive IC 20, the resistor 26, and the terminal T4 of the drive IC 20. That is, one end of the resistor 26 is connected to the terminal T3 of the drive IC 20, and the other end thereof is connected to the terminal T4 thereof. The drain of the constant-current switching element 24 is connected to the control terminal, i.e. the gate, of the switching element SȲ# via the terminal T5 of the drive IC 20. The gate of the constant-current switching element 24 is connected to the drive controller 28.

The other end of the resistor 26 is also connected to the drive controller 28 via the terminal T6 of the drive IC 20. The voltage drop across the resistor 26 is detected as a voltage Vc at the terminal T6, and the voltage Vc at the terminal T6 is inputted to the drive controller 28. That is, the voltage drop across the resistor 26 is equivalent to a potential difference between the terminals T6 and T3 of the drive IC 20. Because the potential at the terminal T3 is set to the constant voltage level determined by the regulator 22, the voltage Vc at the terminal T6 can be used as a measurement of the voltage drop across the resistor 26. The drive controller 28 is operative to control a level of voltage to be applied to the gate of the constant-current switching element 24 to regulate the voltage Vc at the terminal T6 to a target value. This regulation controls the voltage drop across the resistor 26 to a constant value, thus adjusting, to a constant level, a charge current to be supplied to the gate of the switching element SȲ# from the voltage regulator 22 via the terminal T3, the resistor 26, the terminal T4, the constant-current switching element 24, and the terminal T5.

The gate of the switching element SȲ# is also connected to the terminal T7 of the drive IC 20 via the resistor 30. The drain of the first discharge switching element 32 is connected to the terminal T7, and the source thereof is connected to the emitter of the switching element SȲ# via the common potential line of the drive unit DU and the terminal T13 of the drive IC 20. The gate of the first discharge switching element 32 is connected to the drive controller 28. The gate of the switching element SȲ# is further connected to the terminal T8 of the drive IC 20 via the resistor 34. The drain of the second discharge switching element 36 is connected to the terminal T8, and the source thereof is connected to the emitter of the switching element SȲ# via the common potential line of the drive unit DU and the terminal T13 of the drive IC 20. The gate of the second discharge switching element 36 is connected to the drive controller 28.

That is, a first positive-charge dissipating path, in other words, a first negative-charge storing path is provided between the gate of the switching element SȲ# and the common potential line via the resistor 30, the terminal T7, the first discharge switching element 32, and the terminal T13. Similarly, a second positive-charge dissipating path, in other words, a second negative-charge storing path is provided between the gate of the switching element SȲ# and the common potential line via the resistor 34, the terminal T8, the second discharge switching element 36, and the terminal T13.

Each of the resistors 30 and 34 is a linear element. The resistors 30 and 34 have respective resistances, i.e. gate resistances, R1 and R2; the resistance R1 of the resistor 30 is lower than the resistance R2 of the resistor 34. The difference between the resistances R1 and R2 of the resistors 30 and 34 results in the difference in resistance between the first and second negative-charge storing paths. Selecting one of the first and second negative-charge storing paths enables active gate control for the switching element SȲ#.

That is, the resistance of each of the first and second negative-charge storing paths serves as a parameter for adjusting the rate of discharging the gate of the switching element SȲ#, in other words, the rate of storing negative-charge on the gate of the switching element SȲ# according to this embodiment. Changing the resistance in the discharge path of the switching element SȲ# between the different resistances R1 and R2 aims to effectively reduce both a surge and switching loss due to the switching operations of the switching element SȲ#.

Note that, as described above, the drive unit DU according to this embodiment uses constant-current control to supply a constant charge current to the gate of the switching element SY#, thus storing a positive charge on the gate of the switching element SY#. In comparison to a case where the drive unit DU uses constant-voltage control to apply a constant voltage to the gate of the switching element SY#, the drive unit DU according to this embodiment aims to establish reduction of both a surge and switching loss due to the switching operations of the switching element SY#.

The drive controller 28 is operative to apply a voltage to the gate of each of the first and second discharge switching elements 32 and 36 to thereby turn on or off a corresponding one of the first and second discharge switching elements 32 and 36.

In this embodiment, the drive controller 28 turns on one of the constant-current switching element 24 and the first or second discharge switching element 32 or 36 while turning off the other thereof complementarily, thus alternately turning on and off the switching element SY#.

Specifically, the drive controller 28 turns on the constant-current switching element 24 in response to a rising edge of the corresponding drive signal gY# while turning off each of the first and second discharge switching elements 32 and 36. During a corresponding on duration of the drive signal gY#, the drive controller 28 keeps on the constant-current switching element 24 while keeping off each of the first and second discharge switching elements 32 and 36. In response to a falling edge of the corresponding drive signal gY#, the drive controller 28 turns off the constant-current switching element 24 while turning on each of the first and second discharge switching elements 32 and 36. During a corresponding off duration of the drive signal gY#, the drive controller 28 keeps off the constant-current switching element 24 while keeping on each of the first and second discharge switching elements 32 and 36.

The switching element SY# has a sense terminal St for outputting a minute current associated with a current, such as a collector current, flowing through the conductive path between the collector and emitter thereof. The sense terminal St is connected to both the common potential line of the drive unit DU via the resistor 38 and the drive controller 28 via the terminal T9.

When a collector current flows through the conductive path of the switching element SY#, a minute current associated with the collector current flows through the resistor 38, so that a voltage drop across the resistor 38 occurs. The drive controller 28 measures the voltage drop across the resistor 38 as a sense voltage Vse, thus obtaining, according to the measured sense voltage Vse, information indicative of the magnitude of the collector current flowing through the switching element SY#. That is, the level of the sense voltage Vse correlates with the magnitude of the collector current flowing through the switching element SY#.

On the other hand, the gate of the switching element SY# is connected to the terminal T12 of the drive IC 20 via the resistor 40. The terminal T12 is connected to the drain of the soft-turnoff switching element 44, and the source thereof is connected to the common potential line of the drive unit DU. The resistance R3 of the resistor 40 is set to be higher than the resistance values R1 and R2 of the resistors 30 and 34. This setting aims to increase the resistance of an electrical path including the soft-turnoff switching element 44 between the gate of the switching element SY# and the common potential line of the drive IC 20 to be higher than that of each of the first and second positive-charge dissipating paths. The electrical path including the soft-turnoff switching element 44 will be referred to as a high-resistance discharge path hereinafter.

The drive controller 28 is operative to obtain the magnitude of collector current flowing through the switching element SY# as a function of the sense voltage Vse inputted via the terminal T9, and determine whether the magnitude of collector current flowing through the switching element SY# exceeds a predetermined acceptable upper threshold therefor.

Upon determination that the magnitude of collector current flowing through the switching element SY# is equal to or lower than the acceptable upper threshold, the drive controller 28 determines that the switching element SY# is operating in normal state, and therefore turns on or keeps on at least one of the first and second discharge switching elements 32 and 36. The ON state of each of the first and second discharge switching elements 32 and 36 dissipates the charge stored in the gate of the switching element SY# via the high-resistance discharge path, so that the switching element SY# is turned off.

Otherwise, upon determination that the magnitude of collector current flowing through the switching element SY# exceeds the acceptable upper threshold, the drive controller 28 determines that the switching element SY# is operating in abnormal state. Then, the drive controller 28 turns off each of the constant-current switching element 24, the first discharge switching element 32, and the second switching element 36 while turning on the soft-turnoff switching element 44. The turn-on of the soft-turnoff switching element 44 dissipates the charge stored in the gate of the switching element SY# via the high-resistance discharge path, so that the switching element SY# is turned off slowly. Because the high-resistance discharge path is higher in resistance than each of the first and second positive-charge dissipating paths, the turnoff speed of the switching element SY# via the high-resistance discharge path in the abnormal state is lower than that of the switching element SY# via each of the first and second positive-charge dissipating paths in the normal state.

In addition, upon determination that the magnitude of collector current flowing through the switching element SY# exceeds the acceptable upper threshold, the drive controller 28 outputs a fail-safe signal FL for the switching element SY# to the low-voltage system via the terminal T15; the fail-safe signal FL represents the abnormal state in the operation of the switching element SY#. In this embodiment, the low voltage system includes a fail-safe unit 14b in, for example, the interface 14. The fail-safe signal FL is inputted to the fail-safe unit 14b, and the fail-safe unit 14b shuts down each of the inverter INV and the converter CNV.

An example of the structure of the fail-safe unit 14b is illustrated in FIG. 2.

Specifically, the fail-safe unit 14b is comprised of a set of a low-voltage power source 50, an active-low switching element 52, and a resistor 54 provided for each of the photocouplers 14a. The fail-safe unit 14b is also comprised of a photocoupler 60 for each of switching element SY#, a low-voltage power source 62, a resistor 64, a comparator 66, resistors 68 and 70, and a NAND gate 72.

One end of the photodiode of each of the photocouplers 14a is connected to one end of the resistor 54 and the control unit 18, and the other end thereof is grounded. The other end of the resistor 54 is connected to the low-voltage power source 59 via the switching element 52. The control terminal of the switching element 52 is connected to an output terminal of the NAND gate 72. Each of the photocouplers 14a is ON if a low-voltage signal is inputted to a corresponding one of the switching elements 52 so that the photodiode is energized and the phototransistor is ON. Otherwise, each of the photocouplers 14a is OFF if a high-voltage signal is inputted to a corresponding one of the switching elements 52 so that the photodiode is de-energized and the phototransistor is OFF. While the photocoupler 14a is ON, a voltage signal based on a corresponding drive signal gȲ# is inputted to the drive controller 28 via the terminal T2.

Each of the photocouplers 60 is comprised of a photodiode and a phototransistor. One end of the photodiode of each of the photocouplers is connected to the terminal T15, and the other end thereof is grounded. The phototransistors of the respective photocouplers 60 are connected in series to constitute a series-connected photocoupler module. One end terminal of the series-connected photocoupler module is connected to the inverting input terminal of the comparator 66, and the other end terminal is grounded. The resistors 64 and 68 constitute a voltage divider that divides a voltage applied from the low-voltage source 62, and the divided voltage by the voltage divider is inputted to the non-inverting input terminal of the comparator 66. The low-voltage source 62 is also connected to the inverting input terminal of the comparator 66 via the resistor 70.

If no fail-safe signals FL are outputted from the drive controller 28, the inverting input terminal of the comparator 66 is grounded, so that a voltage signal with a low level is outputted from the comparator 66 to the control unit 18. In contrast, if a fail-safe signal FL for at least one switching element SȲ#, referred to as a target switching element SȲ#, is outputted from the drive controller 28, the photocoupler 60 for the target switching element SȲ# is turned off. The turnoff of the photocoupler 60 causes a voltage applied from the low-voltage battery 52 to the inverting input terminal of the comparator 66 to be higher than the divided voltage applied to the non-inverting input terminal of the comparator 66, resulting in reverse of the low level of the voltage signal outputted from the comparator 66 to a high level. The high-level voltage signal of the comparator 66 is sent to the control unit 18 and the NAND gate 72.

The NAND gate 72 has two input terminals, one of which is connected to the output terminal of the comparator 66, and the other thereof is connected to the control unit 18. Thus, the high-level voltage signal outputted from the comparator 66 is inputted to the control unit 18 as a fail-safe signal FL1.

The control unit 18 is operative to normally output a voltage signal having a high level to the NAND gate 72 via the other input terminal if the fail-safe signals FL1 is not inputted thereto. Thus, if no fail-safe signals FL are outputted from the drive controller 28 so that the high-level voltage signal is outputted from the comparator 66, a voltage signal having a low level is outputted from the NAND gate 62 to the control terminals of the active-low switching elements 52 provided for the respective switching elements SȲ#. Thus, the active-low switching elements 52 are turned on or kept on, so that the switching elements SȲ# are ON. That is, if no fail-safe signals FL are outputted from the drive controller 28, the switching elements SȲ# are ON.

In contrast, if a fail-safe signal FL for at least one switching element SȲ# is outputted from the drive controller 28 so that the low-level voltage signal is outputted from the comparator 66, a voltage signal having a high level is outputted from the NAND gate 62 to the control terminals of the active-low switching elements 52 provided for the respective switching elements SȲ#. Thus, the active-low switching elements 52 are turned off or kept off, so that all the switching elements SȲ# are OFF. That is, if at least one fail-safe signal FL is outputted from the drive controller 28, all the switching elements SȲ# are OFF, so that each of the inverter INV and converter CNV are shut down.

In addition, the gate of the switching element SȲ# is connected to the drain of the off-state holding switching element 42, the source of which is connected to the common potential line of the drive unit DU. The off-state holding switching element 42 is adapted to short-circuit the electrical path between the gate and source of the switching element SȲ#. In order to reduce the resistance of the gate and source of the switching element SȲ# as low as possible, the off-state holding switching element 42 is located as close as possible to the switching element SȲ#. The impedance of an electrical path including the off-state holding switching element 42 between the gate and source of the switching element SȲ# is set to be lower than that of each of the first and second positive-charge dissipating paths. The electrical path including the off-state holding switching element 42 will be referred to as a short-circuit path hereinafter. This setting aims to prevent the switching element SȲ# from erroneously being ON due to high-frequency noise superimposition on the gate thereof through the medium of parasitic capacitance between first and second ends, i.e. the emitter and collector, of the conductive path of the switching element SȲ# during the OFF state of the switching element SȲ#.

The gate of the off-state holding switching element 42 is connected to the drive controller 28 via the terminal T11 of the drive IC 20. The gate of the switching element SȲ# is connected directly to the drive controller 28 via the terminal T10 of the drive IC 20. An electrical path between the gate of the switching element SȲ# and the drive controller 28 via the terminal T10 serves as a gate-voltage monitor line for monitoring a voltage difference between the first end (emitter) of the conductive path of the switching element SȲ# and the gate thereof as a level of gate voltage, i.e. gate-emitter voltage, Vge.

That is, the drive controller 28 is operative to monitor the level of the gate voltage Vge through the gate-voltage monitor line, and determine whether the monitored level of the gate voltage Vge is in agreement with an OFF start voltage Vgth during the off duration of the corresponding switching element SȲ#.

Specifically, during the on duration of the switching element SȲ# to charge the gate of the switching element SȲ# or during the off duration of the switching element SȲ# to discharge the gate of the switching element SȲ# with the monitored level of the gate voltage Vge being higher than the OFF start voltage Vgth, the drive controller 28 turns off or keeps off the off-state holding switching element 42. On the other hand, during the off duration of the switching element SȲ# to discharge the gate of the switching element SȲ# with the monitored level of the gate voltage Vge being equal to or lower than the OFF start voltage Vgth, the drive controller 28 turns on the off-state holding switching element 40.

The ON state of the off-state holding switching element 42 short-circuits the gate and emitter of the switching element SȲ# to thereby holding the OFF state of the switching element SȲ#. For example, the drive controller 28 is operative to turn off the off-state holding switching element 42 in synchronization with the turnoff of the second discharge switching element 36.

Next, a charging and discharging control routine including active gate control for a switching element SȲ# carried out by the drive controller 28 of each drive unit DU will be described hereinafter with reference to FIGS. 3 and 4.

Figure 3:
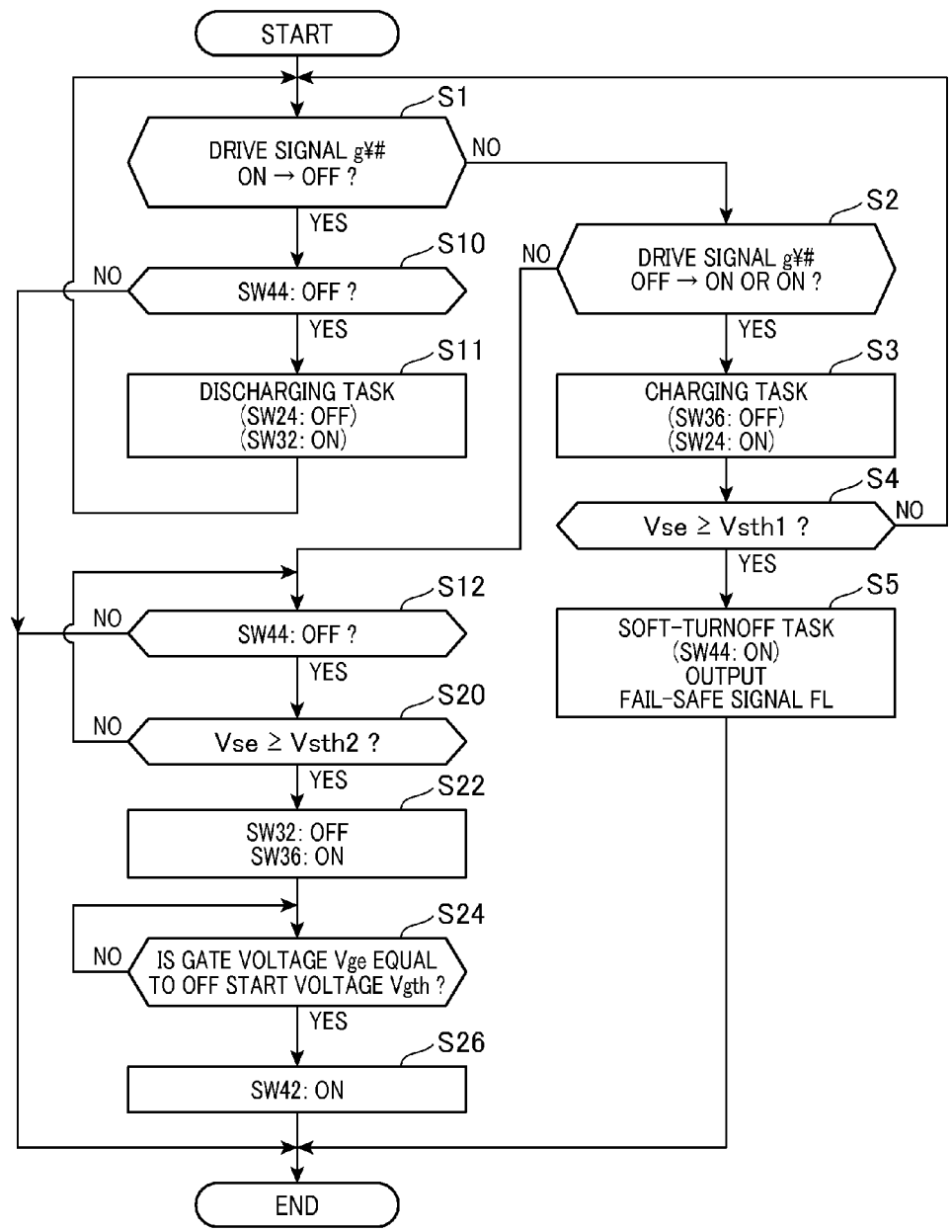
FIG. 3 is a flowchart schematically illustrating an example of the charging and discharging control routine carried out by each drive unit of the control system illustrated in FIG. 1.

FIG. 3 is a flowchart schematically illustrating the charging and discharging control routine. Note that the drive controller 28 of each drive unit DU can be configured as a programmed logic circuit, a hard-wired logic circuit, or the combination of hardwired-logic and programmed-logic hybrid circuits. The drive controller 28 is configured to repeatedly carry out the charging and discharging control routine while the drive unit DU is powered. In FIG. 3, switching elements are abbreviated as "SW".

Figure 4:
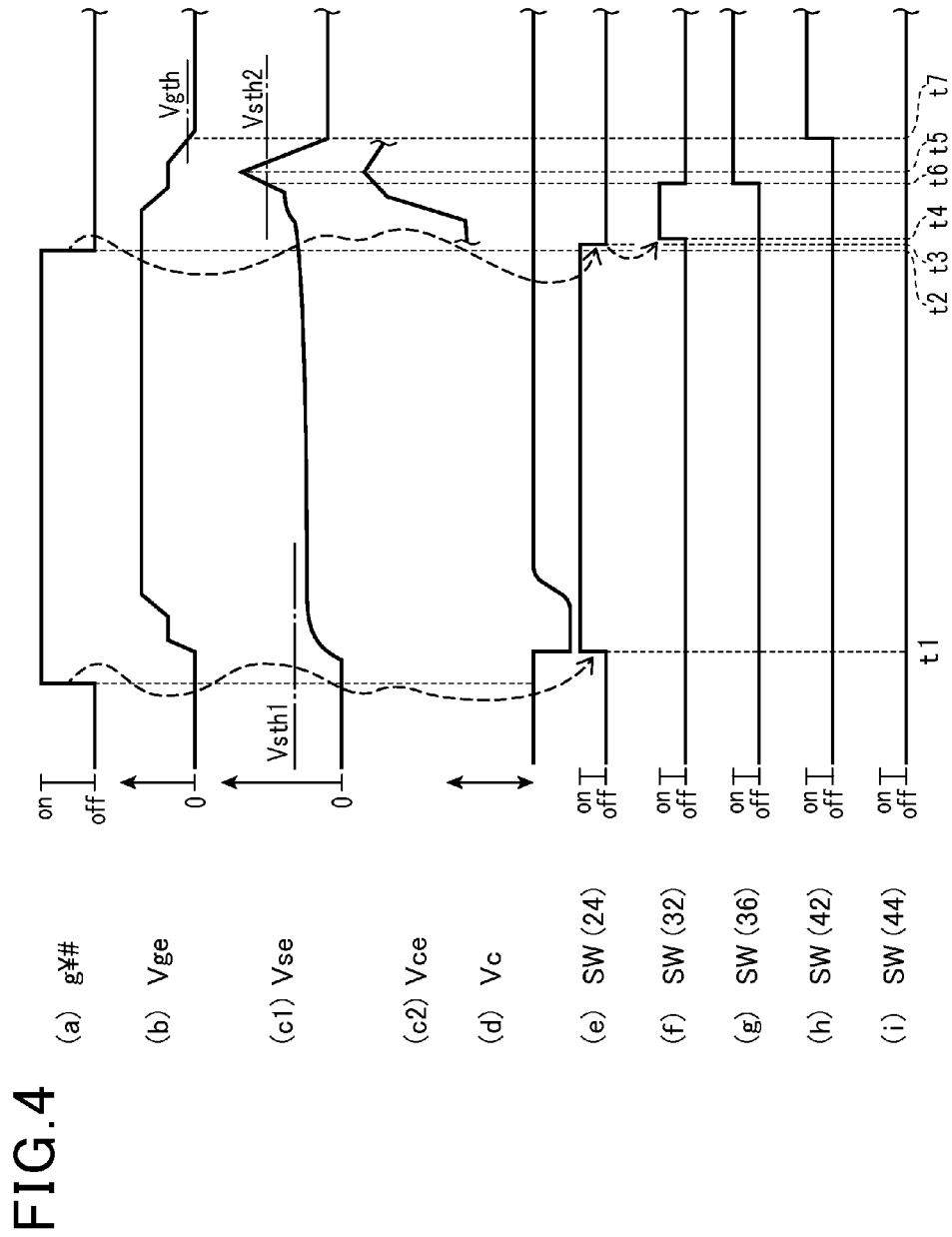
FIG. 4 is a timing chart schematically illustrating an example of specific steps of the charging and discharging control routine by each drive unit while a corresponding switching element is normally operating.

FIG. 4 schematically illustrates specific steps of the charging and discharging control routine by the drive controller 28 of the drive unit DU while the corresponding switching element SY# is normally operating. How the drive signal gY# varies is illustrated in (a) of FIG. 4, and how the gate voltage Vge varies is illustrated in (b) of FIG. 4. How the sense voltage Vse varies is illustrated in (c1) of FIG. 4, and how the collector-emitter voltage Vice varies is illustrated in (c2) of FIG. 4, and how the voltage Vc at the terminal T6 depending on the voltage drop across the resistor 26 varies is illustrated in (d) of FIG. 4. How the constant-current switching element 24 is driven is illustrated in (e) of FIG. 4, and how the first discharge switching element 32 is driven is illustrated in (f) of FIG. 4. How the second discharge switching element 36 is driven is illustrated in (g) of FIG. 4, how the off-state holding switching element 42 is driven is illustrated in (h) of FIG. 4, and how the soft-turnoff switching element 44 is driven is illustrated in (i) of FIG. 4.

When a drive signal gY# is inputted to the drive controller 28 via the terminal T2, the drive controller 28 starts the charging and discharging control routine, and receives the drive signal gY# in step S1.

In step S1, the drive controller 28 determines whether the drive signal gY# is shifted from ON to OFF.

As described above, if the drive signal gY# is a high level so that the photocoupler 14a is ON, a low voltage level is inputted to the drive controller 28 via the terminal T2. Otherwise, if the drive signal gY# is a low level so that the photocoupler 14a is OFF, a high voltage level is inputted to the drive controller 28 via the terminal T2. That is, if the drive signal gY# is shifted from ON, i.e. the high level, to OFF, i.e. the low level, the voltage level inputted to the drive controller 28 via the terminal T2 is shifted from the low level to the high level.

Upon determination that the inputted voltage level via the terminal T2 is not shifted from the low level to the high level, that is, is not shifted from ON to OFF (NO in step S1), the drive controller 28 carries out the operation in step S2.

In step S2, the drive controller 28 determines whether the drive signal gY# is shifted from OFF to ON or is ON.

Upon determination that the drive signal gY# is shifted from OFF to ON or is ON (YES in step S2), the drive controller 28 operates in a charge mode to perform a charging task in step S3. That is, the drive controller 28 turns off the first or second discharge switching element 32 or 36, which has been in on state by the previous discharging task described later, and applies a drive voltage on the gate of the constant-current switching element 24 to turn on the constant-current switching element 24 (see time t1 in FIG. 4). The turn-on of the constant-current switching element 24 increases the gate voltage Vge using the voltage Vc at the terminal T6 to charge the gate of the switching element SY# by the charge current to be supplied to the gate of the switching element SY# while controlling the charge current to a constant level in step S3. The charge of the gate of the switching element SY# causes the switching element SY# to turn on, in other words, the conductive path of the switching element SY# to be closed.

After the operation in step S3, the drive controller 28 determines whether the sense voltage Vse inputted via the terminal T9 is equal to or higher than a first threshold voltage Vsth1 in step S4. The first threshold voltage Vsth1 is a voltage parameter as a function of the predetermined acceptable upper threshold for the magnitude of collector current flowing through the switching element SY# being ON. For example, if there were a short-circuit in a load of the motor-generator 10 corresponding to the switching element SY#, the magnitude of collector current flowing through the switching element SY# could increase so that the sense voltage Vse could exceed the first threshold voltage Vsth1.

That is, upon determination that the sense voltage Vse inputted via the terminal T9 is equal to or higher than the first threshold voltage Vsth1 (YES in step S4), the drive controller 28 determines that the switching element SY# is operating in abnormal state due to an overcurrent, which has a magnitude higher than the first threshold Vsth1, flowing through the switching element SY# as collector current. Then, in step S5, the drive controller 28 performs a soft-turnoff task to:

turn on the soft-turnoff switching element 44 while turning off each of the constant-current switching element 24, the first discharge switching element 32, and the second switching element 36; and output the fail-safe signal FL to the low-voltage system via the terminal T15.

The turn-on of the soft-turnoff switching element 44 dissipates the charge stored in the gate of the switching element SY# via the high-resistance discharge path, thus turning off the switching element SY#, in other words, opening the conductive path of the switching element SY#. As described above, the high-resistance discharge path is higher in resistance than each of the first and second positive-charge dissipating paths. Thus, the turnoff speed of the switching element SY# via the high-resistance discharge path in such an abnormal state is lower than that of the switching element SY# via each of the first and second positive-charge dissipating paths in the normal state. This reduction in the turnoff speed of the switching element SY# while such an overcurrent is flowing through the switching element SY# results in the suppression of a surge produced due to the turnoff of the switching element SY#. In addition, as described above, the fail-safe signal FL shuts down each of the inverter INV and the converter CNV.

Otherwise, upon determination that the sense voltage Vse inputted via the terminal T9 is lower than the first threshold voltage Vsth1 (NO in step S4), the drive controller 28 determines that the switching element SY# is normally operating. Then, the routine returns to step S1, and the drive controller 28 carries out the determination in step S1.

Because the drive signal gY# is ON, the drive controller 28 carries out the operations in steps S3, S4 and/or S5. If the switching element gY# is normally operating (no execution of the operation in step S5), the operations in steps S3 and S4 result in an increase in the charge stored in the gate of the switching element SY#. In other words, they results in an increase in the gate voltage Vge based on the voltage Vc at the terminal T6 while the charge current to be supplied to the gate of the switching element SY# is adjusted to the constant level (see the period between time t2 and the time t1 in (b) FIG. 4). At that time, if the switching element SY# is normally operating, for example, the sense voltage Vse gradually rises under the first threshold voltage Vsth1.

Note that, as illustrated in (d) of FIG. 4, when the constant-current switching element 24 is turned on, the output voltage of the regulator 22, which has been applied to the terminal T6, is applied to the gate of the switching element SY# via the constant-current switching element 24. This results in a rapid drop of the voltage Vc at the terminal T6. The increase in the charge on the gate of the switching element SY# on the basis of the charge current causes the gate voltage Vge of the switching element SY# to approach the output voltage of the regulator 22, resulting in a gradual increase of the voltage Vc at the terminal T6 up to the output voltage level of the regulator 22.

In addition, note that, as illustrated in (b) FIG. 4, during the on duration of the drive signal gY#, the gate voltage Vge increases at a predetermined gradient first. Then, the gate voltage Vge stays at a middle potential between 0 V and the output voltage level of the regulator 22.

Thereafter, the gate voltage Vge increases at a predetermined gradient again. The period during which the gate voltage Vge has stayed at the middle potential will be referred to as a mirror period hereinafter. The mirror period is defined depending on the characteristics of a corresponding switching element SY#.

After lapse of the on duration of the drive signal gY#, the drive signal gY# is shifted from ON to OFF (see the time t2 in FIG. 4). At that time, the drive controller 28 detects the shift of the state of the drive signal gY# based on the shift of the inputted voltage level via the terminal T2 from the low level to the high level (YES in step S1). Then, the drive controller 28 carries out the operation in step S10.

In step S10, the drive controller 28 determines whether the soft-turnoff switching element 44 is OFF. The step of determination of whether the soft-turnoff switching element 44 is OFF is to prevent an increase in the discharging rate of the gate of the switching element SY# due to turn-on of the first discharge switching element 32 during the period when the charge stored in the gate of the switching element SY# is being dissipated via the high-resistance discharge path, in other words, the period when the switching element SY# is being turned off slowly.

Upon determination that the soft-turnoff switching element 44 is ON (NO in step S10), the drive controller 28 terminates the routine.

Otherwise, upon determination that the soft-turnoff switching element 44 is OFF (YES in step S10), the drive controller 28 operates in a discharge mode to perform a discharging task in step S11. That is, the drive controller 28 turns off the constant-current switching element 24 (see time t3 in FIG. 4), and applies a drive voltage on the gate of the first discharge switching element 32 to turn on the first discharge switching element 32 (see time t4 in FIG. 4). The turn-on of the first discharge switching element 32 dissipates the charge stored in the gate of the switching element SY#.

After the operation in step S11, the routine returns to step S1, and the drive controller 28 carries out the determination in step S1.

Because the drive signal gY# is OFF, each of the determinations S1 and S2 is negative, so that the routine proceeds to step S12. At that time, the discharge of the gate of the switching element SY# reduces the gate voltage Vge via the first positive-charge dissipating path (see after the time t4 in FIG. 4). The discharge of the gate of the switching element SY# causes the switching element SY# to turn off, in other words, the conductive path of the switching element SY# to be opened.

Note that, as in the case of the increase in the gate voltage Vge, during the off duration of the drive signal gY#, the gate voltage Vge decreases at a predetermined gradient first. Then, the gate voltage Vge stays at the middle potential during the mirror period, and thereafter decreases at the predetermined gradient again.

In step S12, the drive controller 28 determines whether the soft-turnoff switching element 44 is OFF in step S12. The condition of whether the soft-turnoff switching element 44 is OFF aims to determine whether the execution of active gate control is valid, in other words, the sense voltage Vse as an input signal for the active gate control is valid therefor.

Upon determination that the soft-turnoff switching element 44 is ON (NO in step S12), the drive controller 28 determines that the execution of the active gate control is invalid, in other words, the sense voltage Vse is invalid for the active gate control. Then, the drive controller 28 terminates the routine.

Otherwise, upon determination that the soft-turnoff switching element 44 is OFF (YES in step S12), the drive controller 28 determines that the execution of the active gate control is valid, in other words, the sense voltage Vse is valid for the active gate control. Then, the drive controller 28 carries out the next operation in step S20 to thereby validate the execution of the active gate control, in other words, validate the sense voltage Vse for the active gate control.

That is, the following first and second conditions are required for validating the execution of the active gate control, in other words, the sense voltage Vse as an input signal for the active gate control in this embodiment:

the first condition is that the drive signal gY# is OFF; and
the second condition is that the soft-turnoff switching element 44 is OFF.

In other words, only when both the first and second conditions are true, the drive controller 28 validates the execution of the active gate control, in other words, the sense voltage Vse as an input signal for the active gate control in this embodiment.

That is, after affirmative determination in step S12, the drive controller 28 determines whether the level of the sense voltage Vse is equal to or higher than a predetermined second threshold voltage Vsth2 in step S20. Upon determination that the level of the sense voltage Vse is lower than the second threshold voltage Vsth2 (NO in step S20), the routine returns to step S12, and repeats the determinations in respective steps S12 and S20.

How to determine the second threshold voltage Vsth2 according to this embodiment will be described hereinafter.

As described above, the discharge of the gate of the switching element SY# in step S11 reduces the gate voltage Vge. When the gate voltage Vge has stayed for the mirror period, although the collector current starts to decrease, the sense voltage Vse rises (see (c1) of FIG. 4). That is, during the off duration of the drive signal gY#, there is temporarily no correlation between the level of the sense voltage Vse and the magnitude of the collector current flowing through the switching element SY#.

The inventors of this application have found that the timing t5 at which the sense voltage Vse reaches its peak is substantially synchronized with that at which the collector-emitter voltage Vce, in other words, the voltage across both ends of the conductive path of the switching element SY#, which increases based on the discharge of the gate of the switching element SY#, reaches its peak.

In view of this point found by the inventors, the second threshold voltage Vsth2 is set to a value close to the peak of the sense voltage Vse. That is, if the level of the sense voltage Vse becomes equal to or higher than the second threshold voltage Vsth2 (YES in step S20, see time t6 in FIG. 4), the drive controller 28 determines that the sense voltage Vse is rising up to its peak. Then, the drive controller 28 turns off the first discharge switching element 32 and turn on the second discharge switching element 36 in step S22 (see the time t6 in FIG. 4). The operations in steps S20 and S22 serve as the routine of the active gate control for the switching element SY#. If the first discharge switching element 32 is OFF and the second discharge switching element 36 is ON, the drive controller 28 keeps OFF the first discharge switching element 32, and keeps ON the second discharge switching element 36.

That is, the turnoff of the first discharge switching element 32 and the turn-on of the second discharge switching element 36 change the resistance in the discharge path of the switching element SY# between the different resistances R1 and R2, resulting in an effective reduction of a surge while reducing switching loss as low as possible.

That is, the higher the discharging rate of the gate is, the more switching loss is reduced. In contrast, the lower the discharging rate of the gate is, the more a surge is suppressed. As described above, stay inductance in a line connected to both ends (emitter and collector) of the conductive path of the switching element SY# and the rate of change in current flowing through the switching element SY# serve as electromotive force to produce a surge.

Note that, even if the electromagnetic force increases up to a certain level, no excessively high voltage is applied to the switching element SY# while the voltage across both ends of the conductive path of the switching element SY#, i.e. the collector-emitter voltage Vce, is lower than the output DC voltage across the capacitor C. Thus, it is desirable to increase the resistance of the discharge path of the switching element SY# at the time when the collector-emitter voltage Vce is in agreement with the output DC voltage across the capacitor C.

At that time, the timing at which the collector-emitter voltage Vce reaches the output DC voltage across the capacitor C matches that at which the sense voltage Vse reaches its peak. Using this relationship between the collector-emitter voltage Vce and the sense voltage Vse, the drive controller 28 is configured to determine the timing to change the resistance of the discharge path of the switching element SY# as a function of whether the level of the sense voltage Vse is close to its peak.

After the operation in step S22, the drive controller 28 determines whether the monitored level of the gate voltage Vge is in agreement with the OFF start voltage Vgth in step S24. Upon determination that the monitored level of the gate voltage Vge is not in agreement with the OFF start voltage Vgth (NO in step S24), the drive controller 28 repeats the determination in step S24.

Otherwise, upon determination that the monitored level of the gate voltage Vge is in agreement with the OFF start voltage Vgth (YES in step S24), the drive controller 28 turns on the off-state holding switching element 42 in step S26 (see time t7 in FIG. 4), terminating the routine.

Each of the operations in steps S1, S2, S10, and S12 in the routine serves as a disabling module according to this embodiment. Specifically, upon determination that the drive signal gY# is shifted from OFF to ON or is ON (NO in step S1 and YES in step S2), in other words, the drive signal gY# is ON, the drive controller 28 of each drive unit DU according to this embodiment performs the operations in steps S3, S4, and/or S5 without performing the operations in steps S20 and S22, thus disabling the sense voltage Vse as an input signal for the active gate control. This makes it possible to reliably prevent the second discharge switching element 36 from being shifted from OFF to ON during the on duration of the drive signal gY#.

In addition, upon determination that the soft-turnoff switching element 44 is ON (NO in step S10 or S12), the drive controller 28 of each drive unit DU according to this embodiment skips the operations in steps S20 and S22, thus disabling the sense voltage Vse as an input signal for the active gate control. Upon execution of slow discharge of the gate of the switching element SY# using the high-resistance discharge path including the soft-turnoff switching element 44, it is possible to reliably prevent a discharge path, whose discharge rate is faster than that of the high-resistance discharge path, from being formed.

Second Embodiment

A control system for controlling the motor-generator 10 according to a second embodiment of the present disclosure will be described with reference to FIG. 5.

The structure and/or functions of the control system according to the second embodiment are mainly identical to those of the control system according to the first embodiment except for the following points. So, the different points will be mainly described hereinafter.

The charging and discharging control routine including active gate control for a switching element SY# according to the second embodiment is configured to further limit a period during which the sense voltage Vse as an input signal for the active gate control is valid in comparison to that according to the first embodiment.

FIG. 5 is a flowchart schematically illustrating the charging and discharging control routine according to the second embodiment. In the charging and discharging control routine according to the second embodiment, like steps to the charging and discharging control routine according to the first embodiment, to which like step numbers are assigned, are omitted or simplified to avoid redundant description.

As illustrated in FIG. 5, upon affirmative determination in step S1 or S10, the drive controller 28 of each DU measures time elapsed since the shift of the drive signal gY# to OFF, and operates in the discharge mode to perform the discharging task set forth above in step S11A.

In addition, upon determination that the soft-turnoff switching element 44 is OFF (YES in step S12), the drive controller 28 determines whether the measured elapsed time exceeds preset time T in step S28.

Upon determination that the measured elapsed time does not exceed the preset time T (NO in step S28), the drive controller 28 performs the operations in steps S20, S22, S24, and/or S26. Otherwise, upon determination that the measured elapsed time exceeds the preset time T (YES in step S28), the routine skips the operations in steps S20 and S22, and the drive controller 28 performs the operations in steps S24 and/or S26, thus disabling the sense voltage Vse as an input signal for the active gate control. Note that the preset time T is preferably determined to be equal to or lower than the time required for the switching element SY#, which is operating in normal state, to be shifted to the off state in response to the shift of the drive signal gY# to the off state. More preferably, the preset time T is determined to be equal to or lower than the time required for the collector-emitter voltage Vice of the switching element SY#, which is operating in normal state, to rise from 0 V up to half of the output DC voltage across the capacitor C.

That is, if it is determined that the measured elapsed time exceeds the preset time T, the switching element SY# is estimated to be OFF. Thus, in this case, it is unnecessary to change the resistance of the discharge path of the switching element SY# based on the active gate control.

As described above, the limitation according to this embodiment makes it possible to prevent execution of change in the resistance of the discharge path of the switching element SY# if there is no need of the resistance change. This further reduces the potential for malfunctions in the circuit associated with the switching element SY# in the control system due to noise superimposition on the sense voltage Vse in addition to the aforementioned technical effects achieved in the first embodiment.

Third Embodiment

A control system for controlling the motor-generator 10 according to a third embodiment of the present disclosure will be described with reference to FIG. 6.

The structure and/or functions of the control system according to the third embodiment are mainly identical to those of the control system according to the first embodiment except for the following points. So, the different points will be mainly described hereinafter.

The charging and discharging control routine including active gate control for a switching element SY# according to the third embodiment is configured to further limit a period during which the sense voltage Vse as an input signal for the active gate control is valid in comparison to that according to the first embodiment.

FIG. 6 is a flowchart schematically illustrating the charging and discharging control routine according to the third embodiment. In the charging and discharging control routine according to the third embodiment, like steps to the charging and discharging control routine according to the first embodiment, to which like step numbers are assigned, are omitted or simplified to avoid redundant description.

As illustrated in FIG. 6, upon determination that the soft-turnoff switching element 44 is OFF (YES in step S12), the drive controller 28 determines whether the level of the gate voltage Vge is equal to or lower than a predetermined voltage level Vg1 in step S30.

Upon determination that the level of the gate voltage Vge is higher than the predetermined voltage level Vg1 (NO in step S30), the drive controller 28 performs the operations in steps S20, S22, S24, and/or S26. Otherwise, upon determination that the level of the gate voltage Vge is equal to or lower than the predetermined voltage level Vg1 (YES in step S30), the routine skips the operations in steps S20 and S22, and the drive controller 28 performs the operations in steps S24 and/or S26, thus disabling the sense voltage Vse as an input signal for the active gate control. Note that the predetermined voltage level Vg1 is preferably determined to be equal to or lower than a threshold voltage Vth defined to the switching element SY#; if the level of the gate voltage Vge reaches the threshold voltage Vth, the switching element SY# is turned on.

That is, if it is determined that the level of the gate voltage Vge is equal to or lower than the predetermined voltage level Vg1 equal to or lower than the threshold voltage Vth, the switching element SY# is estimated to be OFF. Thus, in this case, it is unnecessary to change the resistance of the discharge path of the switching element SY# based on the active gate control.

As described above, the limitation according to this embodiment makes it possible to prevent execution of change in the resistance of the discharge path of the switching element SY# if there is no need of the resistance change. This further reduces the potential for malfunctions in the circuit associated with the switching element SY# in the control system due to noise superimposition on the sense voltage Vse in addition to the aforementioned technical effects achieved in the first embodiment.

Fourth Embodiment

A control system for controlling the motor-generator 10 according to a fourth embodiment of the present disclosure will be described with reference to FIG. 7.

The structure and/or functions of the control system according to the fourth embodiment are mainly identical to those of the control system according to the first embodiment except for the following points. So, the different points will be mainly described hereinafter.

The charging and discharging control routine including active gate control for a switching element SY# according to the fourth embodiment is configured to further limit a period during which the sense voltage Vse as an input signal for the active gate control is valid in comparison to that according to the first embodiment.

FIG. 7 is a flowchart schematically illustrating the charging and discharging control routine according to the fourth embodiment. In the charging and discharging control routine according to the fourth embodiment, like steps to the charging and discharging control routine according to the first embodiment, to which like step numbers are assigned, are omitted or simplified to avoid redundant description.

As illustrated in FIG. 7, upon determination that the soft-turnoff switching element 44 is OFF (YES in step S12), the drive controller 28 determines whether the off-state holding switch 42 has been OFF in step S32.

Upon determination that the off-state holding switch 42 has not been OFF (NO in step S32), the drive controller 28 performs the operations in steps S20, S22, S24, and/or S26. Otherwise, upon determination that the off-state holding switch 42 has been ON (YES in step S32), the routine skips the operations in steps S20 and S22, and the drive controller 28 performs the operations in steps S24 and/or S26, thus disabling the sense voltage Vse as an input signal for the active gate control.

That is, if it is determined that the off-state holding switch 42 has been ON, the short-circuit path between the gate and source of the switching element SY# including the off-state holding switching element 42 has already been formed. Thus, in this case, it is unnecessary to change the resistance of the discharge path of the switching element SY# based on the active gate control.

As described above, the limitation according to this embodiment makes it possible to prevent execution of change in the resistance of the discharge path of the switching element SY# if there is no need of the resistance change. This further reduces the potential for malfunctions in the circuit associated with the switching element SY# in the control system due to noise superimposition on the sense voltage Vse in addition to the aforementioned technical effects achieved in the first embodiment.

Fifth Embodiment

A control system for controlling the motor-generator 10 according to a fifth embodiment of the present disclosure will be described with reference to FIG. 8.

The structure and/or functions of the control system according to the fifth embodiment are mainly identical to those of the control system according to the first embodiment except for the following points. So, the different points will be mainly described hereinafter.

The drive controller 28 of each drive unit DU according to the fifth embodiment is configured to invalidate the sense voltage Vse of a corresponding switching element SY# as an input signal for the active gate control if the temperature of the switching element SY# excessively rises.

As illustrated by a phantom line in FIG. 2, the control system according to this embodiment includes a temperature detector 80 for detecting the temperature of the switching element SY# or detecting information as a function of the temperature thereof. The temperature detector 80 is connected to the drive controller 28, and configured to output information indicative of the temperature of the switching element SY# to the drive controller 28. The electrical connection between the temperature detector 80 and the drive controller 28 can be eliminated for simple illustration of the control system illustrated in FIG. 2. The temperature detector 80 can be eliminated from the control system 100 according to the first embodiment.

FIG. 8 is a flowchart schematically illustrating the routine of abnormal diagnosis in the switching element S¥# according to this embodiment; this routine is repeatedly carried out by the drive controller 28 of each drive unit DU while the drive unit DU is powered.

When launching the routine, the drive controller 28 determines whether the temperature Tj of the switching element S¥# obtained based on the information outputted from the temperature detector 80 exceeds a predetermined threshold temperature Tjth in step S40. The operation in step S40 aims to determine whether there is an abnormality in the switching element S¥# due to its temperature being excessively high. The threshold temperature Tjth is determined to be equal to or lower than an acceptable upper threshold of temperature of the switching element S¥#.

Upon determination that the temperature Tj of the switching element S¥# does not exceed the predetermined threshold temperature Tjth (NO in step S40), the drive controller 28 terminates the routine. Otherwise, upon determination that the temperature Tj of the switching element S¥# exceeds the predetermined threshold temperature Tjth (YES in step S40), the drive controller 28 turns on the soft-turnoff switching element 44, and forcibly turns or keeps off the first and second discharge switching element 32 and 36 independently of the level of the sense voltage Vse. The turn-on of the soft-turnoff switching element 44 makes it possible to prevent an unexpected large voltage higher than the withstand voltage of the switching element S¥# from being applied to the switching element S¥#. That is, the drive unit DU for each switching element S¥# is configured to perform, as a fail-sage task, avoidance of the application of an unexpected large voltage to the switching element S¥# in a higher priority in comparison to reduction of switching loss of the switching element S¥#.

As described above, the drive controller 28 of each drive unit DU according to this embodiment reliably prevents the temperature of a corresponding switching element S¥# from excessively rising in addition to the aforementioned technical effects achieved in the first embodiment.

The drive units DU and the control system according to each of the first to fifth embodiments can be modified.

In each of the first to fifth embodiments, each of the operations in steps S1 and S2 in the charging and discharging control routine, serving as a disabling module, is designed to determine whether the drive signal g¥# is ON. However, the present disclosure is not limited to the design. Specifically, each of the operations in steps S1 and S2 in the charging and discharging control routine, serving as a disabling module, can be designed to determine whether a drive signal, i.e. the drive voltage, on the gate of the constant-current switching element 24 for driving the switching element S¥# is a high level, that is, ON.

In each of the first to fifth embodiments, the operations in steps S11 and S22 serve as, for example, an adjusting module configured to change a value of a parameter correlating with a negative-charge storing rate, in other words, a positive-charge dissipating rate, of the switching element S¥#. That is, the operation in step S22 increases the resistance in the discharge path of the switching element S¥# to reduce the discharging rate of the switching element S¥#. However, the adjusting module according to the present disclosure is not limited to the configuration.

Specifically, in step S11A, the drive controller 28 can turn on both the first and second discharge switching elements 32 and 36, and in step S22A, the drive controller 28 can turn off one of the first and second discharge switching elements 32 and 36 (see FIG. 9A). The operation in step S22 reduces the discharging rate of the switching element S¥#.

In this modification, during an on duration of the drive signal g¥#, if the sense voltage Vse becomes equal to or higher than the second threshold voltage Vsth2 due to noise superimposition on the sense voltage Vse, the drive controller 28 can turn off one of the first and second discharge switching elements 32 and 36 to reduce the discharging rate of the switching element S¥#. In other words, the drive controller 28 can perform active gate control of the discharge path of the switching element S¥#, thus reducing the discharging rate of the switching element S¥#. Particularly, even if the soft-turnoff switching element 44 is ON so that the switching element S¥# is being turned off slowly, the execution of the active gate control does not increase the discharging rate of the switching element S¥#.

However, during the fail-safe task to turn off the switching element S¥# slowly, it is effective in disabling the reduction in the discharging rate of the switching element S¥# during an on duration of the switching element S¥# in the same manner as the respective embodiments. This is because such a redundant task to reduce the discharging rate of the switching element S¥# during the fail-safe task of the switching element S¥# may cause noise, and therefore, it is undesirable.

In addition, in each of the first to fifth embodiments, the first negative-charge storing path including the resistor 30 and the first discharge switching element 32 and the second negative-charge storing path including the resistor 34 and the second discharge switching element 36 are provided, but the present disclosure is not limited thereto.

Specifically, the first negative-charge storing path including the resistor 30 can only might be provided. In this modification, in step S11B, the drive controller 28 can control a drive voltage on the gate of the first discharge switching element 32 to adjust a current flowing through the first discharge switching element 32 to a target level. In addition, in step S22B, the drive controller 28 can reduce the target level, thus reducing the discharging rate of the switching element S¥#. These operations in steps S11B and S22B make it possible to change a parameter for adjusting the rate of discharging the gate of the switching element S¥#.

In each of the first to fifth embodiments, the gate resistances of the resistors 30 and 34 are each used as a parameter for adjusting the rate of storing negative-charge on the gate of the switching element S¥, but the present disclosure is not limited thereto.

Specifically, a voltage level to be applied to the gate of the switching element S¥ can be used as a parameter for adjusting the rate of storing negative-charge on the gate of the switching element S¥.

In this modification, in step S11C, the drive controller 28 can apply a negative bias voltage to the gate of the witching element S¥ by, for example, connecting the gate to a portion lower in potential than the emitter. In addition, in step S22C, the drive controller 28 can apply a zero voltage to the gate of the witching element S¥ by, for example, connecting the gate to the emitter.

In each of the first to fifth embodiments, the drive controller 28 changes a parameter for adjusting the rate of storing negative-charge on the gate of the switching element S¥ as a function of the level of the sense voltage Vse, but the present disclosure is not limited thereto.

Specifically, the drive controller 28 can change a parameter for adjusting the rate of storing negative-charge on the gate of the switching element S¥ as a function of the rate of change of the sense voltage Vse. In addition, the drive controller 28 changes the parameter as a function of the rate or level of change of the sense voltage Vse in response to the increase in the sense voltage Vse based on the shift of the drive signal gY# from ON to OFF, but the present invention is not limited thereto. Specifically, the drive controller 28 can change the parameter as a function of the rate or level of change of the sense voltage Vse in response to the decrease in a current, i.e. a collector current flowing through the conductive path of the switching element SY# based on the shift of the drive signal gY# from ON to OFF. In this modification, a detector 82 for detecting a variable correlated with the current, i.e. the collector current flowing through the conductive path of the switching element SY#, which is connected to the sense terminal St can be provided. The detector 82 can be configured to directly detect the collector current. FIG. 2 schematically illustrates the detector 82, such as a hall element, configured to directly detect the collector current. The detector 82 can be eliminated from the control system 100 according to the first embodiment.

The drive controller 28 can change a parameter for adjusting the rate of storing negative-charge on the gate of the switching element SY as a function of the potential difference, i.e. the gate voltage Vge, between one end, i.e. the emitter, of the conductive path of the switching element SY# and the on-off control terminal, i.e. the gate thereof. The drive controller 28 also can change a parameter for adjusting the rate of storing negative-charge on the gate of the switching element SY as a function of the voltage, i.e. the collector-emitter voltage Vce, across both the ends of the conductive path thereof. In other words, each of the level or change rate of the sense voltage Vse, the gate voltage Vge, and the collector-emitter voltage Vce can be used as a parameter for adjusting the rate of storing negative-charge on the gate of the switching element SY because it is a parameter representing how shift of one of the on state and the off state of the switching element SY# to the other thereof proceeds.

In the first embodiment, the operation in step S4 for determining whether a current flowing through the conductive path of the switching element becomes equal to or higher than the acceptable upper threshold therefor serves as a diagnostic module. In the fifth embodiment, each of the operation in step S4 and that in step S40 for determining whether the temperature Tj of the switching element SY# exceeds the predetermined threshold temperature Tjth serves as a diagnostic module. However, the diagnostic module can be configured to determine whether the power supply voltage for each component of the drive unit DU excessively decreases to be lower than a predetermined acceptable lower limit.

In each of the first to fifth embodiments, one of the on state and the off state of the switching element SY# is set to the on state, and the other thereof is set to the off state, and electrical charge to shift the first state, i.e. the on state, to the second state, i.e. the off state is set to negative charge. However, the present disclosure is not limited to the settings. In other words, a period during which the adjusting module changes a value of the parameter correlating with the charging rate of the switching element SY# is not limited to that during which positive charge is dissipated from the gate of the switching element SY#. For example, a period during which the adjusting module changes a value of the parameter correlating with the charging rate of the switching element SY# can be set to that during which positive charge is stored on the gate of the switching element SY#.

In each of the first to fifth embodiments, an IGBT is used as a switching element SY# of each drive unit DU, but an N-channel MOSFET or a P-channel MOSFET can be used as a switching element SY# of each drive unit DU. If a P-channel MOSFET is used as a switching element SY# of each drive unit DU, because a potential difference from the on-off control terminal, i.e. the gate, of the P-channel MOSFET to one end, i.e. the source, thereof is set to be a negative value turns the P-channel MOSFET to on state. Thus, in this case, the drive controller 28 stores positive charge on the gate of the P-channel MOSFET, i.e. the switching element SY#, to turn off the P-channel MOSFET.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for driving a voltage-controlled switching element having a conductive path and an on-off control terminal according to a drive signal indicating selectively a first state and a second state of the voltage-controlled switching element, the first state being one of an on state and an off state of the voltage-controlled switching element, the second state being the other state thereof, the driver comprising:
   a charging module configured to store electrical charge on the on-off control terminal of the voltage-controlled switching element via a normal electrical path connected to the on-off control terminal to charge the voltage-controlled switching element upon the drive signal indicating a change of the voltage-controlled switching element from the first state to the second state, thus changing the voltage-controlled switching element from the first state to the second state;
   an adjusting module configured to change a value of a parameter correlating with a charging rate of the voltage-controlled switching element through the normal electrical path as a function of an input signal to the driver to adjust the charging rate therethrough, the input signal representing at least one of: a current flowing through the conductive path, a voltage across both ends of the conductive path, and a voltage at the on-off control terminal; and
   a disabling module configured to disable the adjusting module from changing the value of the parameter if the drive signal indicates the first state of the voltage-controlled switching element.

2. The driver according to claim 1, further comprising:
   a diagnostic module configured to diagnose whether there is an abnormality in at least one of the voltage-controlled switching element and the driver,
   wherein the disabling module is configured to disable the adjusting module from changing the value of the parameter when it is diagnosed that there is an abnormality in at least one of the voltage-controlled switching element and the driver.

3. The driver according to claim 1, wherein:
   the charging module is configured to store a first electrical charge as the electrical charge on the on-off control terminal of the voltage-controlled switching element via the normal electrical path to turn the voltage-controlled switching element to the off state, the charging module further comprising:
  a turnoff electrical path connected to the on-off control terminal and being higher in impedance than the normal electrical path, the charging module being configured to selectively:
  close the turnoff electrical path to store the first electrical charge on the on-off control terminal of the voltage-controlled switching element via the normal electrical path to turn the voltage-controlled switching element to the off state; and
  open the turnoff electrical path,
the disabling module being configured to disable the adjusting module from changing the value of the parameter when the turnoff electrical path is closed.

4. The driver according to claim 3, wherein:
the charging module is configured to close the turnoff electrical path when it is diagnosed that there is an overcurrent flowing through the voltage-controlled switching element as an abnormality therein.

5. The driver according to claim 1, wherein:
the disabling module is configured to:
  determine whether a preset period has elapsed since a timing at which the drive signal selects change the voltage-controlled switching element from the first state to the second state; and
  disable the adjusting module from changing the value of the parameter when it is determined that the preset period has elapsed since the timing at which the drive signal selects indicates the voltage-controlled switching element from the first state to the second state even if the drive signal indicates the second state of the voltage-controlled switching element.

6. The driver according to claim 1, wherein:
the voltage-controlled switching element is turned on upon a potential difference between the on-off control terminal and one of the ends of the conductive path being equal to or higher than a threshold voltage,
the charging module is configured to store a first electrical charge as the electrical charge on the on-off control terminal of the voltage-controlled switching element via the normal electrical path to turn the voltage-controlled switching element to the off state, and
the disabling module is configured to disable the adjusting module from changing the value of the parameter upon the potential difference dropping to be equal to or lower than a preset voltage even if the drive signal indicates the second state of the voltage-controlled switching element, the preset voltage being equal to or lower than the threshold voltage.

7. The driver according to claim 1, wherein:
the charging module is configured to store first electrical charge as the electrical charge on the on-off control terminal of the voltage-controlled switching element via the normal electrical path to turn the voltage-controlled switching element to the off state,
the charging module further comprising:
  an off-holding path connected to the on-off control terminal and being lower in impedance than the normal electrical path, the charging module being configured to selectively:
  close the off-holding path at a timing within a period during which the voltage-controlled switching element is in the off state to thereby hold the off state of the voltage-controlled switching element; and
  open the off-holding electrical path,
the disabling module being configured to disable the adjusting module from changing the value of the parameter upon the off-holding electrical path being closed even if the drive signal indicates the second state of the voltage-controlled switching element.

8. The driver according to claim 1, wherein:
the charging module is configured to store a first electrical charge as the electrical charge on the on-off control terminal of the voltage-controlled switching element via the normal electrical path to turn the voltage-controlled switching element to the off state,
the voltage-controlled switching element having a sense terminal from which a current correlating with the current flowing through the conductive path is outputted,
the adjusting module being configured to change the value of the parameter using an electrical variable correlating with the current outputted from the sense terminal as the current flowing through the conductive path in synchronization with a timing when a value of the electrical variable is equal to or higher than a threshold value.

9. The driver according to claim 8, wherein:
the charging module further comprising:
  a turnoff electrical path connected to the on-off control terminal and being higher in impedance than the normal electrical path, the charging module being configured to selectively:
  open the turnoff electrical path; and
  close the turnoff electrical path as a function of the electrical variable correlating with the current outputted from the sense terminal when the drive signal indicates the on state of the voltage-controlled switching element.

10. The driver according to claim 9, wherein:
the charging module is configured to close the turnoff electrical path when it is diagnosed that there is an overcurrent flowing through the voltage-controlled switching element as an abnormality therein.

11. The driver according to claim 1, wherein:
the normal electrical path is provided in plurality, the plurality of normal electoral paths, and
the adjusting module is configured to close at least one of the plurality of normal electoral paths based on a change of the input signal.

12. A control system for controlling a rotary machine, the control system comprising:
  a converter equipped with at least one pair of first voltage-controlled switching elements connected in series, each of the first voltage-controlled switching elements having a conductive path and an on-off control terminal; and
  an inverter equipped with at least one pair of second voltage-controlled switching elements connected in series, each of the second voltage-controlled switching elements having a conductive path and an on-off control terminal; and
  a driver for driving each of the first and second voltage-controlled switching elements according to a drive signal drive signal indicating selectively a first state and a second state of a corresponding one of the first and second voltage-controlled switching elements to thereby boost a DC voltage inputted to the converter, and invert the boosted DC voltage into an AC voltage to be supplied to the rotary machine, the first state being one of an on state and an off state of a corresponding one of the first and second voltage-controlled switching elements, the second state being the other thereof, the driver for each of the first and second voltage-controlled switching elements comprising:
  a charging module configured to store electrical charge on the on-off control terminal of a corresponding one of the first and second voltage-controlled switching elements via a normal electrical path connected to the on-off control terminal to charge a corresponding one of the first and second voltage-controlled switching elements upon the drive signal indicating a change of a corresponding one of the first and second voltage-controlled switching elements from the first state to the second state, thus changing a corresponding one of the first and second voltage-controlled switching elements from the first state to the second state;

an adjusting module configured to change a value of a parameter correlating with a charging rate of a corresponding one of the first and second voltage-controlled switching elements through the normal electrical path as a function of an input signal to the driver to adjust the charging rate therethrough, the input signal representing at least one of: a current flowing through the conductive path, a voltage across both ends of the conductive path, and a voltage at the on-off control terminal; and a disabling module configured to disable the adjusting module from changing the value of the parameter if the drive signal indicates the first state of a corresponding one of the first and second voltage-controlled switching elements.

* * * * *